United States Patent [19]

Fukuzawa et al.

[11] Patent Number: 5,287,377
[45] Date of Patent: Feb. 15, 1994

[54] COUPLED QUANTUM WELL TUNABLE LASER

[75] Inventors: Tadashi Fukuzawa, Tokyo, Japan; Ling Y. Liu, White Plains; Emilio E. Mendez, Croton-on-Hudson, both of N.Y.

[73] Assignee: International Business Machines Corporation, Armonk, N.Y.

[21] Appl. No.: 58,997

[22] Filed: May 6, 1993

Related U.S. Application Data

[63] Continuation of Ser. No. 807,922, Dec. 16, 1991, abandoned.

[51] Int. Cl.$^5$ .............................................. H01S 3/19
[52] U.S. Cl. ........................................ 372/45; 372/46; 372/20; 372/75
[58] Field of Search ................. 372/45, 20, 75, 46

[56] References Cited

U.S. PATENT DOCUMENTS

| | | | |
|---|---|---|---|
| 4,700,353 | 10/1987 | Van Gieson et al. | 372/45 |
| 4,823,352 | 4/1989 | Sugimoto | 372/45 |
| 4,885,753 | 12/1989 | Okai et al. | 372/45 |
| 4,999,842 | 3/1991 | Huang et al. | 372/45 |
| 4,999,844 | 3/1991 | Imamoto | 372/45 |
| 5,023,879 | 6/1991 | Wang et al. | 372/45 |
| 5,068,867 | 11/1991 | Hasenberg et al. | 372/45 |

FOREIGN PATENT DOCUMENTS

| | | |
|---|---|---|
| 8916611 | 12/1989 | France . |
| 2656168 | 6/1991 | France . |

OTHER PUBLICATIONS

S. Charbonneau et al. "Transformation of Spatially Direct to Spatially Indirect Excitons . . . " Physical Review B, vol. 38, No. 9, Sep. 15, 1988, pp. 6287-6290.
N. N. Islam et al. "Electroabsorption in GaAS/AlGaAs Coupled Quantum Well Waveguides", Appl. Phys. Lett. 50 (16) Apr. 20, 1987, pp. 1098-1100.
T. Fukuzawa, et al. "Phase Transition of an Exciton System in GaAs Coupled Quantum Wells", Physical Review Letters, vol. 64, No. 25 Jun. 18, 1990, pp. 3066-3069.
Alexandrou, "Electric-Field Effects On Exciton Lifetimes", Phys. Rev. B., Nov. 15, 1990 vol. 42, No. 14, pp. 9225-9228.
Fukuzawa, "Phase Transition of An Exciton System", Phys. Rev. Lett., Jun. 18, 1990, vol. 64, No. 25, pp. 3066-3069.
Chen, "Effect of Electric Fields On Exitons", Phys. Rev. B., Sep. 15, 1987 vol. 36, No. 8, pp. 4562-4565.
Islam, "Electroabsorption in GaAs/AlGaAs Coupled Quantum Wells", Appl. Phys. Lett. vol. 50(16), Apr. 20, 1987, pp. 1098-1100.
Mendez, "Effect of An Electric Field On The Luminescence of GaAs Quantum Wells", Phys. Rev. (B), vol. 26, No. 12, Dec. 15, 1982, pp. 7101-7104.
Zayhowski, "Stark Effect In $Al_xGa_{1-x}$ As/GaAs Coupled Quantum Wells", Appl. Phys. Lett., vol. 50, No. 21, May 25, 1987, pp. 1518-1520.

Primary Examiner—Georgia Y. Epps
Attorney, Agent, or Firm—Blaney Harper; Robert M. Trepp

[57] ABSTRACT

The present invention is the use of coupled quantum wells in the active region of a semiconductor laser to modulate the frequency and amplitude of the light output of the laser. In a particular embodiment of the present invention the coupled quantum wells are contained in a graded index of refraction semiconductor double heterostructure laser. The active region of this tunable laser consists of two quantum wells having a width of approximately 50 Angstroms or less which are separated by a barrier layer having a width of approximately 20 Angstroms or less. The quantum well material is intrinsic GaAs and the barrier layer is $Al_xGa_{1-x}As$ wherein $x=0.23$. The active region is surrounded by the double heterostructure in which one side is doped p-type and the second side is doped n-type. The resulting laser is a p-i-n type structure. A reverse bias with respect to the flat band voltage of the p-i-n structure is applied across the p-i-n structure which modulates both the frequency and the intensity of the laser output. The tunable laser is pumped with a variety of conventional means, including both electrical and optical pumping. The modulation of the wavelength is approximately linear over a 1.5 volt operating range. A tunable laser, such as the present invention, having an output wavelength modulated by an electric field is useful in the field of optical communications and computing.

16 Claims, 6 Drawing Sheets

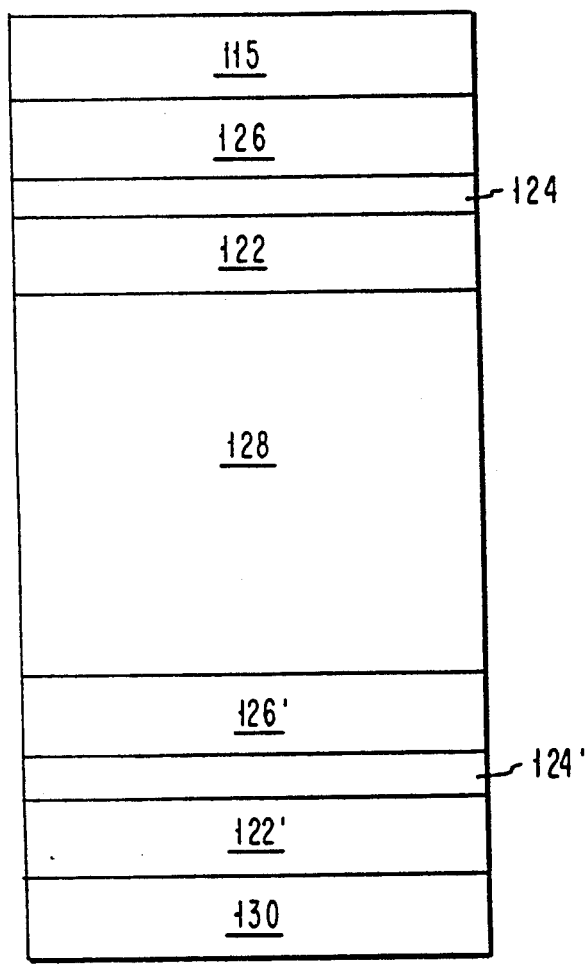

5,287,377

COUPLED QUANTUM WELL TUNABLE LASER

GOVERNMENT CONTRACT

This invention was made with Government support under DAAL-03-90-C-0008 awarded by the Department of the Army. The Government has certain rights in this invention.

This application is a continuation of application Ser. No. 07/807,922, filed on Dec. 16, 1991, now abandoned.

FIELD OF THE INVENTION

This invention relates generally to the field of semiconductor devices. In particular, this invention relates to a semiconductor laser device. More specifically, this invention relates to a coupled quantum well laser capable of having the output light wavelength and amplitude tuned by an electric field.

BACKGROUND OF THE INVENTION

The use of optical communication promises to significantly enhance communications and computing power. This is because more information can be encoded when transmitting light than when transmitting electrical signals. In order to represent (or encode data) and transmit data with light, the transmitted light signal must be controlled so that the receiver can detect the information being sent. Controlling a light signal means transmitting a light signal with a very well defined wavelength and being able to modulate the transmitted light wavelength. Quantum well semiconductor lasers are very useful for optical communications because they are small and emit light which has a well defined wavelength. Therefore, the laser can be mounted next to a small optical fiber transmission guide and directly emit light having a defined wavelength into the guide.

The problem with semiconductor lasers in optical communications is that the emitted radiation frequency cannot be quickly tuned or significantly modulated. This is important in optical communications because the amount of data which can be transmitted over a single guide dramatically increases when the data can be encoded using different frequencies of light. The frequency of light emitted from semiconductor lasers depends upon the relative positions of the conduction and valence band edges in the materials which form the laser. Changing the relative positions of the conduction and valence bands typically requires changing the temperature of the device or exerting a mechanical pressure on the lattice structure of the device. Applying these types of physical conditions to the laser, in order to tune the frequency of light output, is much slower than is required in order to encode data for optical transmission. Therefore, semiconductor lasers typically cannot encode data using the frequency of the emitted light and, as a result, the capacity for data transmission with a semiconductor laser over a transmission guide is significantly decreased.

Generally, light is emitted from a semiconductor structure due to an electron making a transition from the conduction band of the semiconductor material to the valence band and losing energy in the process. The lost energy is equal to the difference in energy between the conduction band and valence band edges plus the energy above and below the band edges for any one particular electron transition. The energy lost by an electron when making the transition from the conduction band to the valence band is emitted from the semiconductor as light. The light has a frequency which is proportional to the lost energy and a wavelength which is inversely proportional to the lost energy. Since electrons making the transition from the conduction band to the valence band generally have many different values of lost energy, the emitted light does not have a single wavelength or even a narrow band of wavelengths. Typically, the radiation emitted from a semiconductor has a broad spectrum of wavelengths.

In contrast to typical semiconductor light emitting devices, the semiconductor laser emits light having a narrow band of wavelengths. This is because many electrons make transitions between well defined energy bands. The energy bands are well defined because lasing at one wavelength tends to suppress the lasing at other wavelengths. The laser output is useful but the use is limited because the range of output wavelengths is limited. The semiconductor laser has a limited range of output wavelengths because the wavelength is controlled by the material which makes up the laser. One way in which to modify the output wavelength of a laser fabricated with a particular material is to make a quantum well laser. A quantum well laser has multiple discrete conduction and valence states whose energies depend on the width of the quantum well. The quantum well laser output light has a narrow band of wavelengths which is different than the wavelengths produced from a typical semiconductor laser made from the same material and the difference depends on the quantum well width. In effect, the output of a typical semiconductor laser made from a particular material can be changed by forming a quantum well laser from the same material.

The problem with both the typical semiconductor laser and the quantum well laser is that they are not capable of tuning the wavelength of the emitted light once the laser is fabricated. The prior art has attempted to solve this problem by changing the physical conditions of the quantum well laser. These types of physical changes are too slow for practical use of the quantum well laser in communication applications as noted above. The prior art has also attempted to use an applied electric field to modulate both the wavelength and the intensity of a quantum well laser. The proposed devices would operate by modulating the optical transition energies of a quantum well and by changing the number of electrons and holes which recombine as a function of position in a quantum well. The problem with the intensity modulating devices is that the devices merely turned the laser on or off. Lasing only occurred in these devices when there was no electric field present and the devices used the electric field to turn off the laser. The problem with single quantum well lasers which attempt wavelength modulation is that the electric field required to shift the wavelength of the laser is too large for the small shift which is produced. This is because the wavelength shift in a single quantum well is proportional to the square of the electric field and the fourth power of the width of the quantum well. Therefore, large changes in the electric field are required to produce small changes in the wavelength.

OBJECTS OF THE INVENTION

It is an object of the present invention to manufacture an optical modulator and an optical switch.

It is a further object of the present invention to manufacture a semiconductor laser having a frequency modulated light output.

It is still another object of the present invention to manufacture a semiconductor laser having a frequency modulated light output wherein the light frequency is modulated over a wide range.

It is still a further object of the present invention to manufacture a semiconductor laser having a frequency modulated light output wherein the light frequency is modulated with an electric field over a wide range of frequencies.

It is still a further object of the present invention to manufacture a semiconductor laser having a frequency modulated light output wherein the light frequency is modulated with a low level electric field over a wide range.

It is still a further object of the present invention to manufacture a semiconductor laser having a frequency and amplitude modulated light output wherein the light frequency and amplitude is modulated with a low level electric field over a wide range.

SUMMARY OF THE INVENTION

The present invention is the use of coupled quantum wells in the active region of a semiconductor laser to modulate the frequency and amplitude of the light output of the laser. In a particular embodiment of the present invention the coupled quantum wells are contained in a graded index of refraction semiconductor double heterostructure laser. The active region of this tunable laser consists of two quantum wells having a width of approximately 50 Angstroms or less which are separated by a barrier layer having a width of approximately 20 Angstroms or less. The quantum well material is intrinsic GaAs and the barrier layer is $Al_xGa_{1-x}As$ wherein $x=0.23$. The active region is surrounded by the double heterostructure in which one side is doped p-type and the second side is doped n-type. The resulting laser is a p-i-n type structure. A reverse bias with respect to the flat band voltage of the p-i-n structure is applied across the p-i-n structure which modulates both the frequency and the intensity of the laser output. The tunable laser is pumped with a variety of conventional means, including both electrical and optical pumping. The modulation of the wavelength is approximately linear over a 1.5 volt operating range. A tunable laser, such as the present invention, having an output wavelength modulated by an electric field is useful in the field of optical communications and computing.

BRIEF DESCRIPTION OF THE DRAWINGS

FIG. 3 illustrates an alternate physical structure of the active region of a tunable semiconductor laser according to the present invention.

DESCRIPTION OF THE PREFERRED EMBODIMENT

Figure 1:
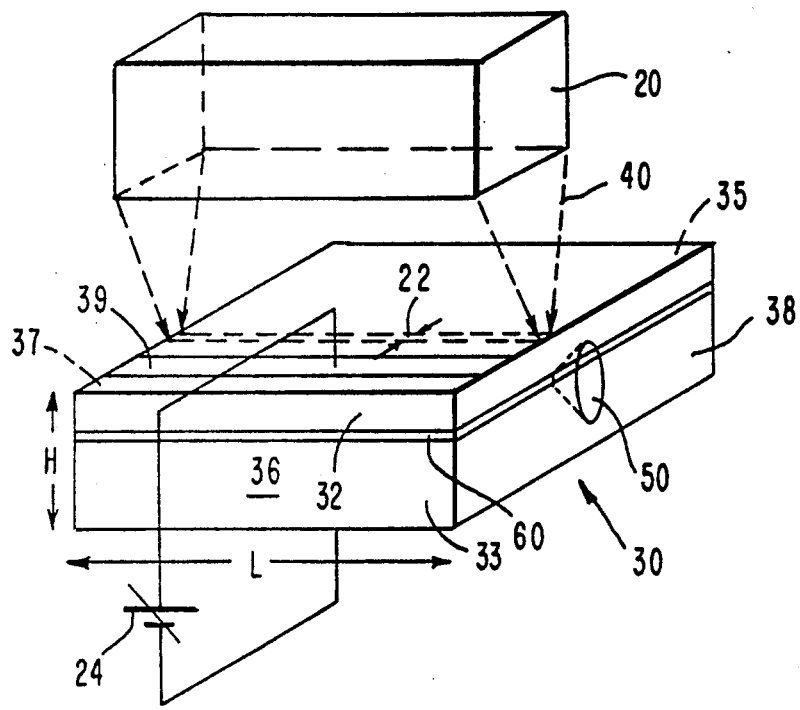
FIG. 1 illustrates an embodiment of the present invention.

FIG. 1 illustrates an embodiment of the present invention. FIG. 1 illustrates a tunable semiconductor laser and a conventional laser wherein the light output of the conventional laser is the light input of the tunable semiconductor laser. The conventional laser 20 emits a monochromatic light 40 having a wavelength of approximately 7600 Angstroms. This light is focused on a region 22 of the semiconductor laser 30 which is approximately 10 microns wide and which runs the length of the semiconductor laser 30. The structure and operation of conventional lasers, such as laser 20, is well known in the art. The conventional laser 20 pumps light energy into the tunable semiconductor laser 30. The tunable semiconductor laser 30 converts the light energy from the conventional laser into a light output 50. The light output 50 has a wavelength and amplitude which is modulated by a voltage applied across the semiconductor laser 30. The semiconductor laser 30 is a multilayer semiconductor structure in which an intrinsic region 60 is interposed between a p-type layer 32 and an n-type layer 36. The p-type layer 32 has a high doping concentration so that a good ohmic contact 39 can be made to it. Ohmic contacts are made to both the p-type and n-type regions and a voltage source 24 is connected to the semiconductor laser 30 through those contacts. The applied voltage modifies the built in electric field across the p-i-n structure of the laser structure 30. The voltage source 24 is used to form an electric field across the region 60 to modulate the frequency and intensity of the output light 50.

The tunable laser 30 comprises a cap p-type region 32 of GaAs doped to approximately $10^{20}$ p type atoms per cubic centimeter ($cm^3$) and is approximately 500 Angstroms thick. Region 32 is connected to a voltage source 24. Region 60 is interposed between the cap p-type region 32 and the n-type region 36. N-type region 36 is a GaAs layer which is doped with an n-type dopant to approximately $10^{18}/cm3$ and is connected to the ground of the voltage source 24. The length (L) of the tunable laser 30 is approximately 300 microns and the height (H) is approximately 140 microns. The light emitting surface 38 and its opposing surface 37 are perpendicular to the plane of the active region. The light emitting surfaces 37 and 38 are facets which are highly reflective. The surfaces of the laser which do not emit light are not necessarily perpendicular to the plane of the active layer and may be irregularly shaped. The active region is formed of multiple coplanar layers of materials having specific properties. The properties of the material layers in the semiconductor structure and their interaction with the applied operating conditions, determine the properties of the light output 50. The output light 50 has a narrow band of wavelengths (similar to output 40) wherein the wavelength and intensity of the output light 50 is modulated by the value of the applied bias 24.

Figure 2A:
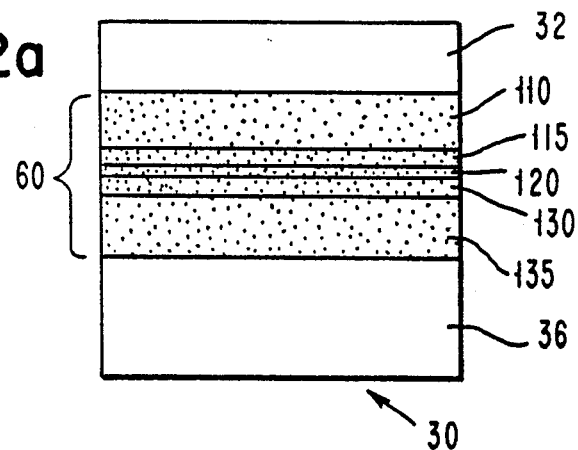
FIGS. 2a and 2b illustrate the physical structure of a tunable semiconductor laser according to the present invention.
Figure 2B:
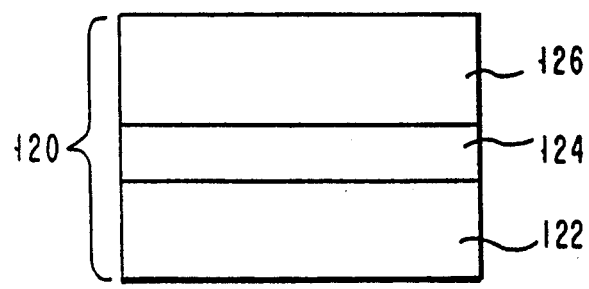

FIGS. 2a and 2b illustrate in detail the vertical structure of the tunable laser 30. FIG. 2a illustrates that the region 60 is interposed between the p-type region 32 and the n-type region 36. Cladding layers 110 and 115 are interposed between the active region 120 and the p-type region 32. Cladding layers 130 and 135 are also interposed between the active layer 120 and the n-type region 36. The cladding layers are layers of $Al_xGa_{1-x}As$ wherein x ranges between 0 and 1 and where the $Al_xGa_{1-x}As$ is doped n or p-type. The first layer 110 is a 6,000 Angstrom layer of $Al_xGa_{1-x}As$ wherein x=0.63 and which is doped p-type to approximately $10^{18}/cm^3$. The second layer 115 is an $Al_xGa_{1-x}As$ layer wherein x gradually decreases from 0.63 to 0.23, the layer is 1,500 Angstroms thick, and is doped p-type to approximately $5 \times 10^{17}/cm^3$. The Al content in layer 115 decreases in a piecewise linear fashion but could also decrease in a parabolic or other fashion.

Layer 115 is interposed between the active region 120 and the layer 110. FIG. 2b illustrates that the active region 120 comprises three layers. The first 122 and third 126 layers of the active region are undoped (or intrinsic) GaAs layers. These layers are approximately 50 Angstroms thick but could range from 20 to 60 Angstroms. The second layer 124 is an undoped $Al_xGa_{1-x}As$ layer in which x=0.23. This layer is approximately 20 Angstroms thick but could range from a monolayer (approximately 3 Å) to 35 Angstroms thick. The width of the second layer 124 is related to the width of the first and third layers. For example, when the first and third layers are 40 Angstroms thick, the second layer 124 ranges from a monolayer to 35 Å thick. When the first and third layers are 50 Angstroms thick, the second layer 124 ranges from a monolayer to 30 Å thick. The maximum thickness of the second layer decreases with an increasing thickness for the first and third layers.

FIG. 2b illustrates that the active region 120 has two quantum wells separated by a thin barrier layer. The active region 120 is adjacent to layer 130 which is a 1,500 Angstrom $Al_xGa_{1-x}As$ layer in which x gradually increases from 0.23 to 0.63. The increase in the aluminum concentration is piecewise linear but could also be parabolic or some other fashion. The layer 130 is doped n-type to a concentration of $5 \times 10^{17}/cm^3$. The graded concentration of aluminum in layers 115 and 130 vary the index of refraction of those layers. The graded index of refraction of layers 115 and 130 confines light emitted from the active region to the area between layers 135 and 110. Layer 130 is interposed between layer 135 and the active region 120. Layer 135 is an $Al_xGa_{1-x}As$ layer in which x=0.63. Layer 135 is 0.8 microns thick and doped n-type to a concentration of $10^{18}/cm^3$. Layer 135 is interposed between layer 130 and the GaAs layer 36.

FIG. 3 illustrates that the active region 120 could also be formed from pairs of quantum wells. The cladding layers 115 and 130 are above and below respectively pairs of coupled quantum wells. Each pair of quantum wells are formed from two layers of intrinsic GaAs having a thickness ranging from 20 to 60 Angstroms. The two layers of GaAs are separated by a layer of $Al_xGa_{1-x}As$ having a thickness ranging between 35 and the thickness of a monolayer. An isolation layer 128 separates the pair of quantum wells formed by layers 126, 124, and 122 from the pair of quantum wells formed by layers 126', 124', and 122'. The isolation layer is, in effect, a very thick barrier layer. The isolation layer 128 has a thickness of at least approximately 100 Angstroms. The material which forms the isolation layer 128 is the same material which forms the barrier layer between individual quantum layers but can also be any other epitaxially compatible material that acts as a barrier between pairs of coupled quantum wells. In this case that material is intrinsic $Al_xGa_{1-x}As$ wherein x=0.23.

Figure 4:
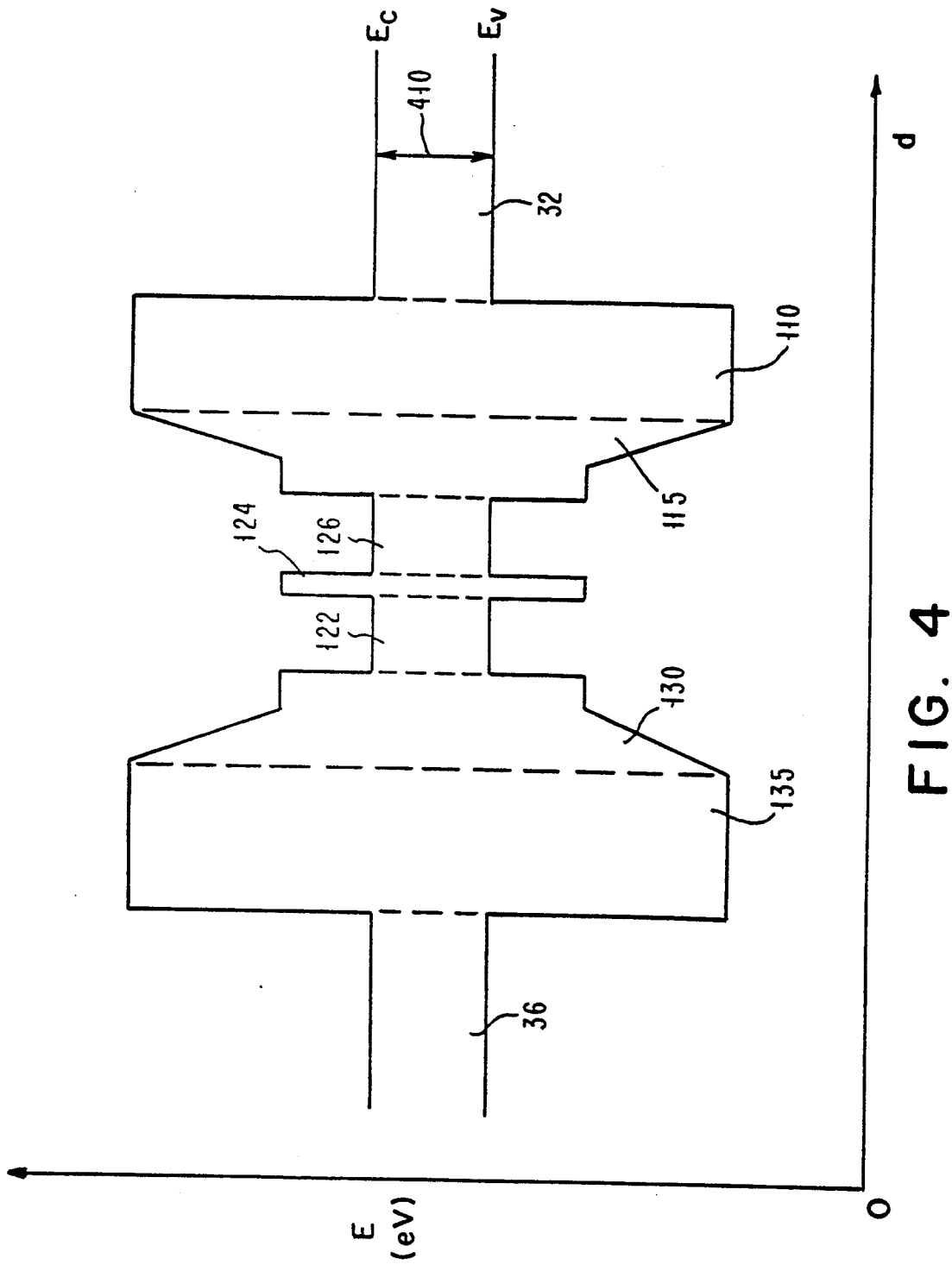
FIG. 4 illustrates the band diagram for the tunable semiconductor laser according to the present invention.

FIGS. 4 and 5 more fully illustrate the operation of the tunable laser 30. FIG. 4 illustrates the conduction and valence bands for the tunable laser 30 when an external voltage has been applied which compensates for the built in voltage of the structure. This condition is also called the flat band condition. The external voltage required to reach flat band conditions in this structure is approximately 1.5 volts applied to the p-type region 32 with respect to the n-type region 36. The active region of the tunable laser 30 consists of layers 122, 124, and 126. These layers are confined within a double heterostructure graded index of refraction (GRINSCH) type structure. The GRINSCH type structure surrounding the active region is well known in the art and is only briefly explained here. The difference 410 between the lower edge of the conduction band (Ec) and the upper edge of the valence band (eV) in the p-type GaAs is approximately 1.43 eV at room temperature. This difference, called the bandgap, is also approximately 1.43 eV on the n-type GaAs layer 36. This difference, increases to approximately 2.0 eV in the layers 110 and 135. This increase in bandgap creates an energy wall that keeps carriers, such as electrons and holes, which are between layers 110 and 135 from moving into layers 32 or 36. Carriers which are injected or otherwise placed between layers 110 and 135 are confined to the region between layers 110 and 135 because they do not have enough energy to surmount the energy wall.

The bandgap linearly decreases in layers 130 and 115, as a function of depth moving toward the active region, because the aluminum concentration in layers 115 and 130 linearly decreases. When the aluminum concentration stays constant as a function of depth (d) in the laser structure, then the bandgap is constant as a function of depth. Layers 122 and 126 have lower bandgaps than the rest of the laser structure because layers 122 and 126 are undoped GaAs layers which does not have aluminum added. Layer 124 is an $Al_xGa_{1-x}As$ composition wherein x is 0.23 and which has a bandgap similar to the quantum well edges of layers 115 and 130. FIG. 4 illustrates that layers 122, 124 and 126 create two quantum wells with carriers confined to those quantum wells by layers 115 and 130.

Confining carriers to the area which contains the quantum wells is important to quantum well lasers because lasing action occurs only when a threshold amount of light is released from carrier transitions between conduction states and valence states in a quantum well. This means that a minimum amount of carriers must be present in the conduction and valence states of the quantum wells to get lasing action. Many carriers will recombine with other energy states in the semiconductor lattice structure and will not be present in the conduction and valence states of the quantum well if there is no confinement. As a result, lasing action will not occur because there are not enough carriers in the quantum well conduction and valence states. The lasing threshold is the minimum amount of current which has to be injected into the quantum well to get lasing action. The lasing threshold is decreased when the energy wall due to layers 110 and 135 is increased. This is because when carriers are injected into the quantum well, fewer have enough energy to surmount the energy wall and so more are available for light production. Similarly, the lasing threshold of the quantum well laser is decreased when the temperature of the device is decreased. Again this is because fewer carriers have the energy to surmount the energy wall. Therefore, varying the temperature of the operation of the laser or varying the height of the energy wall by using different materials for layers 110 or 135 (such as a different amount of aluminum in the AlGaAs composition) merely enhances the efficiency of the device but does not change the manner in which the device operates.

When light is emitted from the quantum well structure, the light must be transmitted from the laser device 30. The quantum wells are interposed between graded index of refraction layers 115, and 130 and the graded index of refraction layers are interposed between two uniform cladding layers 110 and 135. The index of refraction of both the graded and uniform index of refraction layers is less than the index of refraction for the active region. Therefore, the light generated in the active region 120 tends to travel along and within the active region because of the change in the index of refraction between the cladding layers and the active region 120. The width of the active layer is such that there is sufficient overlap between it and the optical mode determined by the cladding layers. In a GRINSCH type structure, the active layer can be less than 100 Angstroms. The optical cavity necessary for laser action is provided by two cleaved facets, 37 and 38, as shown in FIG. 1. These facets could also be provided by etching alone or by adding reflective coatings on surfaces which have been either cleaved or etched. The remaining two surfaces, 33 and 35 are non-mirror surfaces which cannot sustain lasing action in a direction approximately perpendicular to surfaces 33 and 35.

Figure 5A:
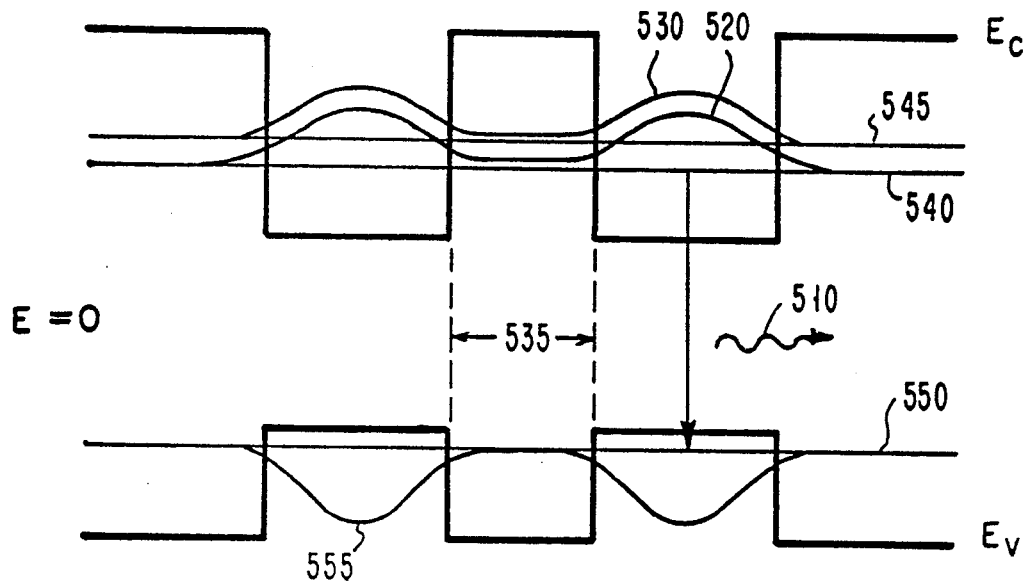
FIGS. 5(a) and 5(b) illustrate the effect of an electric field on the active region of the tunable semiconductor laser according to the present invention.
Figure 5B:
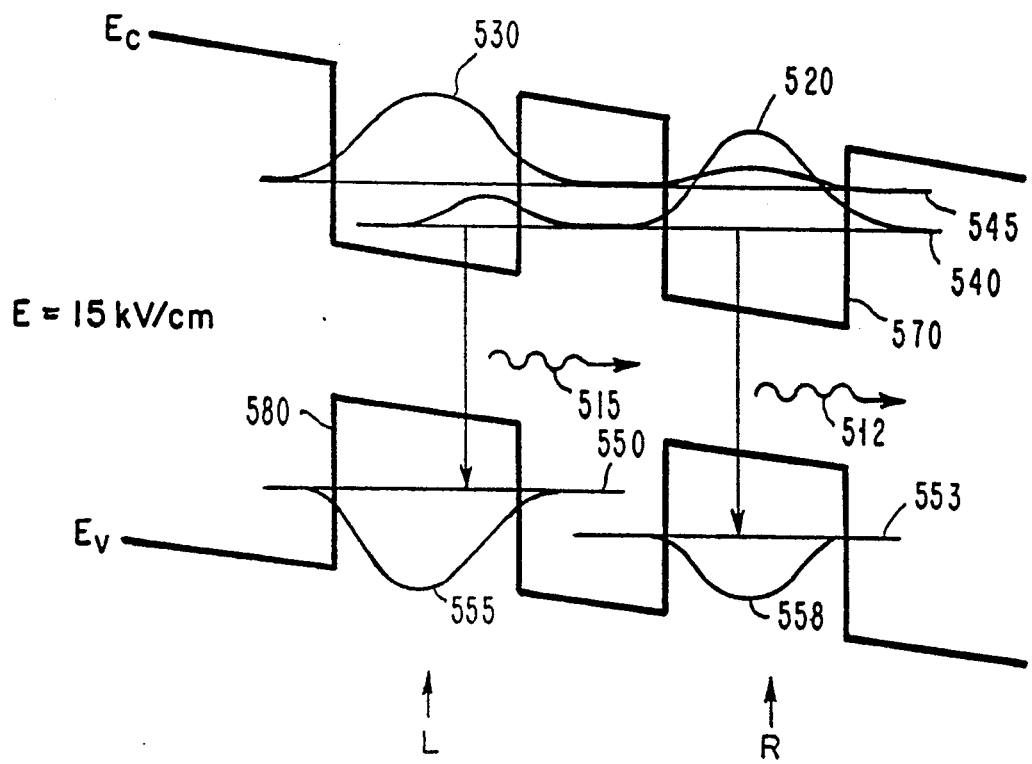

FIG. 5 illustrates the effect of an electric field on the quantum wells of the present invention. FIG. 5(a) illustrates the valence and conduction bands for the active region of the tunable laser 30 when there is no electric field acting on the active region. FIG. 5(b) illustrates the effect of the electric field on the active region of the tunable laser 30. Carriers in a quantum well exist in discrete energy states. An energy state in a single quantum well becomes two energy states when two quantum wells have a thin enough energy barrier 535 between them. When two quantum wells are separated by a thin enough barrier to cause two distinct energy states to be generated from the single energy state in a single quantum well, the quantum wells are coupled. FIG. 5(a) illustrates the probability function of the existence of carriers for each energy state. Probability function 520 represents the probability of an electron being found in symmetric energy state 540 as a function of the position in the quantum wells. The symmetric state is the lower of the two energy states created when quantum wells are coupled. Probability function 530 plots the probability of an electron existing in the antisymmetric energy state 545 as a function of the position in the quantum wells. The antisymmetric state is the higher of the two energy states created when quantum wells are coupled. Energy state 545 is higher than energy state 540 and no energy states exist between 540 and 545. Electrons having energy state 540 or 545 can be found in either quantum well because the electrons tunnel through the energy barrier 535 due to the narrow width of energy barrier 535. Electrons from energy state 540 recombine with holes in the valence states of the quantum well and give off light energy (a photon) 510 in the recombination process. There are two valence states at energy state 550 which substantially overlap when the applied field is zero. Similarly, the valence state probability distribution 555 has an overlapping probability distribution function when no electric field is applied.

FIG. 5(b) illustrates that when an electric field on the order of 15 kilo-volts per centimeter acts on the structure, the conduction and valence probability distribution functions change. First, the energy difference between the symmetric conduction states 540 and antisymmetric conduction states 545 becomes greater. Also, the symmetric valence states 553 and antisymmetric valence states 550 separate, with their associated probability distributions (558 and 555 respectively).

Electrons in the symmetric conduction state 540 become localized in the right (R) quantum well but still have a probability distribution which extends into the left (L) quantum well. Similarly, electrons in the antisymmetric conduction state 545 become localized in the left quantum well with a distribution extending into the right quantum well. Further, holes in valence state 553 are localized in the right quantum well, while holes in valence state 550 are localized in the left quantum well.

Carriers in a particular energy state migrate between quantum wells because of tunnelling action through the energy barrier 535. Both electrons and holes tunnel through energy barrier 535. Electrons tunnel more readily through the energy barrier as compared to holes because electrons have a much smaller effective mass. The probability of tunneling between quantum wells is proportional to $e^{-Vmd}$ wherein V is the potential energy difference between an energy state and the top of the barrier layer, m is the effective mass, and d is the width of the barrier layer. When the thickness of the energy barrier becomes too thick, holes having energy state 550 which are located in the right quantum well under flat band conditions cannot travel to the left quantum well when an electric field acts on the structure. Similarly, holes having energy state 553 which are located in the left quantum well under flat band conditions will not travel to the right quantum well under the influence of an electric field if the energy barrier is too thick. When the electric field acts on the structure, the effective energy barrier thickness decreases. The reason that holes are localized in a single quantum well when an electric field is applied is that a small electric field is sufficient, given the effective mass of holes, to completely localize holes in one quantum well without localizing electrons in one quantum well. The upper limit on the energy barrier thickness for the $Al_xGa_{1-x}As$ metallurgy is approximately 35 Angstroms. This thickness of the energy barrier also reduces the number of electrons tunnelling between quantum wells in the conduction states. The reduction in tunnelling modifies the probability distributions 520 and 530 but electrons will still exist in energy states 540 and 545 in each quantum well because some tunnelling does occur even though no hole tunnelling occurs because of the thick energy barrier and the electric field.

Tunnelling between quantum wells in a particular energy state is important because this is the physical mechanism which allows the electric field to tune the frequency of the laser output. Light is emitted from the tunable semiconductor laser 30 when electrons which are mostly localized in one quantum well (having some probability function in another quantum well) recombine with holes localized in another quantum well and in the process give off energy in the form of a photon. The frequency of the photon is proportional to the difference in energy between the conduction and valence energy states. Therefore, when an electron from state 540 recombines with a hole from state 553, a photon 512 is released with energy proportional to the energy difference between states 540 and 553. Similarly, photons 515 are also produced from the recombination of carriers in states 540 and 550. This is because electrons are available in state 540 and holes are available in state 550 in the left quantum well. When there is not a sufficient supply of holes in state 550 due to lack of tunnelling from the right quantum well to the left quantum well, then fewer recombinations between states take place and fewer photons 515 are produced.

FIG. 5(b) illustrates that the frequency of light emitted from the tunable laser 30 is changed by the applied electric field because the difference in energy for transitions between energy states is varied by the electric field when there are two closely coupled quantum wells. The transition of electrons from conduction state 540 to valence state 550 releases a different frequency of light energy than the transition from state 540 to state 553. This is because of the difference in energy between valence states 550 and 553. Two energy states are created for each energy state in a single quantum well when two quantum wells are closely coupled. When the coupling is close enough so that significant carrier tunnelling occurs, those newly created energy states are populated by electrons and holes from adjacent quantum wells. The individual energy states are adjusted with respect to each other when an electric field acts on the structure. Transitions then occur between the energy states wherein the most transitions occur between conduction and valence states having the lowest difference in energy, provided there is some overlap between the probability distribution functions of those states. Modulation of the electric field modulates the energy difference between the conduction and valence states. As the difference between conduction and valence states is modulated, the wavelength of light emitted is modulated because the wavelength (proportional to the inverse of frequency) is proportional to the energy difference between conduction and valence states. The electric field also modulates the intensity of the emitted light. This is because the electric field modulates the distribution of electrons and holes within the quantum well. As the electrons are pushed to the right in FIG. 5(b), the distribution of electrons is closer to the quantum well wall 570. The quantum well wall 570 is a center for non-radiative recombination. Therefore, as more carriers are pushed into the vicinity of the wall 570, more non-radiative recombination, as well as increased tunneling or thermonic emission, takes place and less light is emitted. Similarly, holes in FIG. 5(b) are pushed to the left to wall 580 and recombine in a nonradiative process to reduce the amount of light emitted by the structure. These non-radiative processes are known in the art and are typically temperature dependent. It is possible for the quantum well laser 30 to take advantage of them by building quantum well walls 570 and 580 which have high non-radiative recombination rates. When a sufficient electric field acts on the structure the lasing action will be stopped. In this way the laser 30 would modulate both the wavelength and the intensity of the output.

Figure 6:
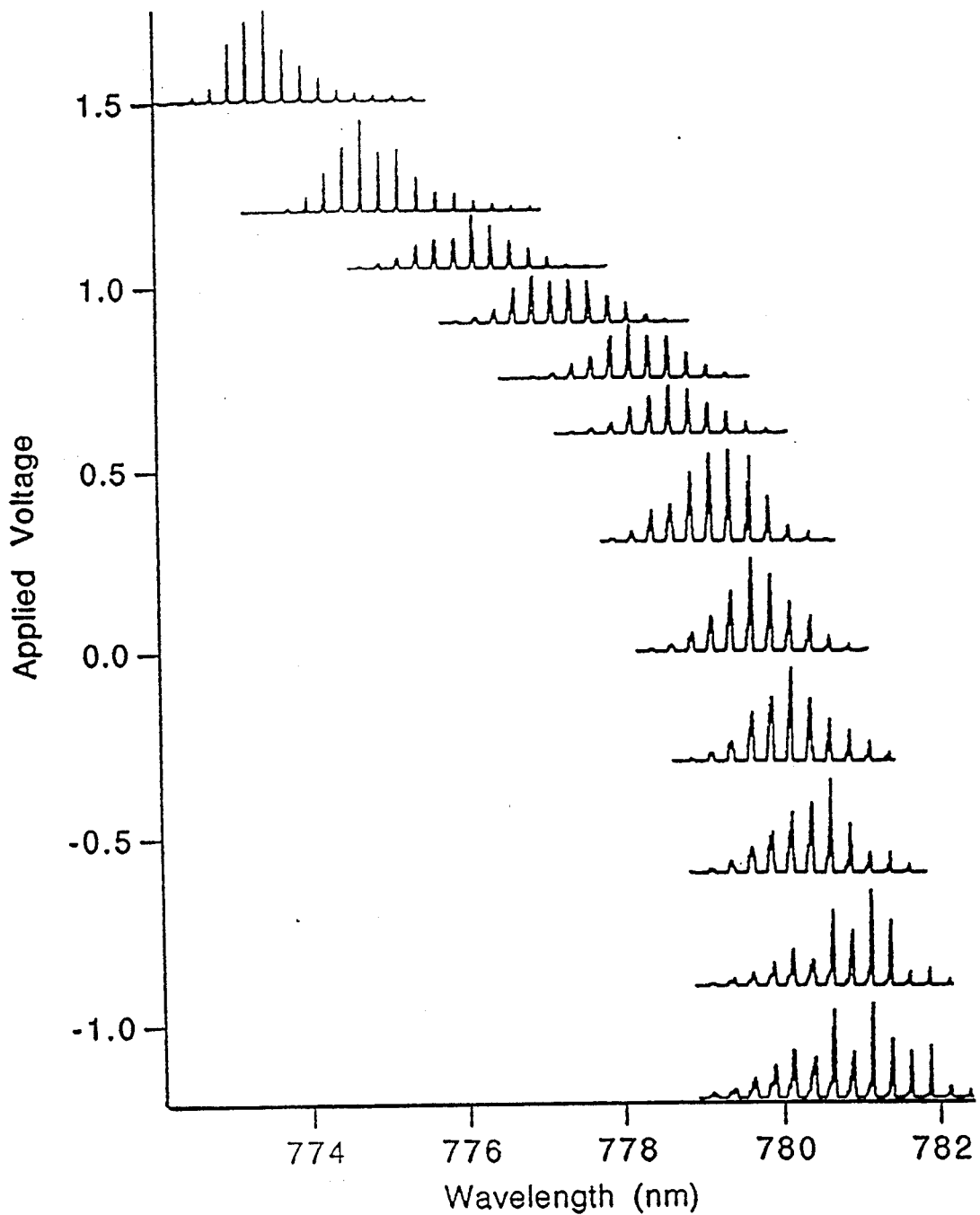
FIG. 6 illustrates the effect of an electric field on the output laser spectrum of the tunable semiconductor laser according to the present invention.

FIG. 6 illustrates the modulation of the wavelength in the tunable laser's output versus the applied voltage. FIG. 6 illustrates the wavelength shift as a function of applied voltage by plotting the intensity of the laser spectrum versus the applied voltage. Each spectrum plotted in FIG. 6 has several different intensity peaks corresponding to the different longitudinal cavity resonances. When no voltage is applied to the semiconductor laser structure 30, the doping of the p-i-n structure sets up a built in electric field. When a voltage of approximately 1.5 volts is applied to p-type region 32 with respect to n-type region 36, the p-i-n structure of the laser 30 is in the flatband condition. No electric field acts on the structure when the structure is in the flatband condition. As the voltage is decreased from 1.5 to 0, the band structure has an electric field applied to it because the built in field of the laser structure is not compensated for by the applied voltage. The electric field becomes greater as the voltage on the device is reduced. As the electric field becomes greater, the wavelength of the output of the laser 30 increases. This wavelength shift is approximately linear with voltage from the flatband condition of 1.5 volts to approximately 0.3 volts. The total shift in wavelength is approximately 7 nanometers (nm) over this range. When the voltage is decreased to below approximately 0.3 volts, the linear shift starts to saturate. This means that the increase in wavelength is less for any decrease in voltage below 0.3 volts. This occurs because when the carriers localize in separate quantum wells due to the electric field, they form a dipole which produces a separate electric field opposing the electric field set up by the built in field of the structure and the applied voltage. As the applied voltage field decreases, the dipole and opposing electric field increases which, in turn, decreases the effect of the applied electric field. As the applied voltage goes to 0 and becomes negative, the electric field across the active region 120 increases and the dipole becomes larger. This results in no net effect on the wavelength of the laser output. When a voltage is applied to the p-i-n structure which is greater than that necessary to produce flatband conditions the p-i-n structure becomes forward biased. The electric field across the active region of the p-i-n structure is 0 V/cm under flatband conditions. When the p-i-n structure is forward biased significant current flows through the p-i-n structure and this prevents a significant voltage (beyond 1.5 volts) from developing across the p-i-n structure. Therefore, no significant electric field develops and the wavelength of the emitted light is not shifted. Even though the wavelength of the emitted light is not shifted, there is still lasing action. Light is still being emitted at voltages above flatband, however, the device is not taking advantage of the coupled quantum wells and therefore no wavelength shift occurs.

Figure 7:
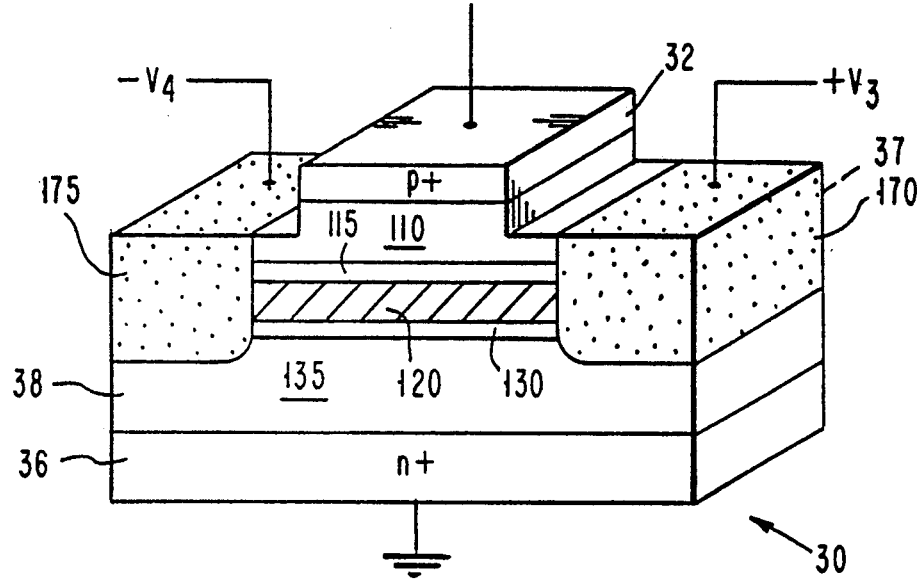
FIG. 7 illustrates the preferred embodiment of the present invention.

FIG. 1 illustrates the operation of an embodiment of the present invention. The pump laser 20 emits light which is the input to tunable laser 30. The light from the pump laser excites electrons existing in the valence states of the quantum wells to the conduction states. Those electrons recombine in the valence states emitting light having a wavelength which is dependent upon the electric field acting across the active layer of the tunable laser 30. The electric field is modulated by the voltage source 24. The pump laser 20 supplies enough carriers which recombine between the quantum well states that the tunable laser reaches the lasing threshold. Light output 50 is the tunable laser output from the laser 30. The tunable laser 30 is typically operated at low temperature to reduce the parasitic effects of excess non-radiative recombination in the devices which occur at higher temperatures. This low temperature in the present case is 5 degrees Kelvin. When the ability to increase the confinement of carriers is increased, through the use of higher energy barrier layer materials, then the tunable laser 30 can be operated at higher temperatures. FIG. 7 illustrates the preferred embodiment of the present invention. This embodiment supplies the conduction states of the quantum well with electrons in a different manner than the embodiment of FIG. 1. The embodiment of FIG. 1 optically pumps the tunable laser 30 by using a pump laser 20 to supply excited carriers to the quantum wells. The embodiment of FIG. 7 electrically pumps the tunable laser by electrically supplying carriers to the quantum well. The tunable semiconductor laser 30 illustrated in FIG. 7 is a multilayer structure having an active region 120 interposed between first cladding layers 110 and 130. First cladding layer 115 is interposed between the active region 120 and a second cladding layer 110. First cladding layer 130 is interposed between the active region 120 and a second cladding layer 135. Second cladding layers 110 and 135 are adjacent contact layers 32 and 36 respectively. The active region 120 comprises at least one pair of coupled quantum wells formed by interposing a barrier layer between two quantum well layers in which the barrier layer has a thickness range of between ranges of between a monolayer and 35 Å and the quantum well layers range from 20 to 60 Å in thickness. The active region may have more than one pair of coupled quantum wells wherein each pair of quantum wells is separated by at least approximately 100 Å. The quantum well layers are undoped GaAs layers and the barrier layer is a layer of $Al_xGa_{1-x}As$ wherein x is approximately 0.23. The first cladding layers 110 and 130 are also layers of $Al_xGa_{1-x}As$, however, x increases in a piecewise linear fashion, as a function of distance away from the active layer, from approximately 0.23 to approximately 0.63. The second cladding layers 115 and 135 are $Al_xGa_{1-x}As$ layers in which x is approximately 0.63. The preferred embodiment differs in the structure of the cladding layers from the embodiment shown in FIG. 1 because the first and second cladding layers are undoped layers. The contact layer 32 adjacent the second cladding layer 115 is doped p-type to a concentration of approximately $5 \times 10^{18}/cm^3$. Also, the contact layer 36 adjacent the second cladding layer 135 is doped n-type to a concentration of approximately $2 \times 10^{18}/cm^3$.

The preferred embodiment of the laser 30 shown in FIG. 7 has reflective facets 37 and 38. These reflective facets can be formed by cleaving or by etching. A subsequent coating of a reflective material can be added to the cleaved (or etched) surfaces to reduce the lasing threshold. The reflective facets are perpendicular with respect to the plane in which the active layer 120 is formed and the facets 37 and 38 form a longitudinal cavity with the active layer. The longitudinal cavity has a longitudinal axis which is parallel to the plane of the active layer 120 and perpendicular to facets 37 and 38. The horizontal dimensions of the longitudinal cavity are formed by diffusion regions 170 and 175. Diffusion 170 is a p-type diffusion which contacts one horizontal end of the longitudinal cavity. Diffusion 170 has a concentration of approximately $5 \times 10^{18}/cm^3$. Diffusion 175 is an n-type diffusion which contacts the second horizontal end of the longitudinal cavity and which has a doping concentration of approximately $2 \times 10^{18}/cm^3$. Diffusions regions 170 and 175 must contact all the layers of the active region 120. Diffusions 170 and 175 are also physically isolated from contact layers 32 and 36 so as to not create a diode or short between the contact layers and the diffusions. The intrinsic cladding layer 110 is etched vertically to separate the diffusion regions 170 and 175 from the contact layer 32. The intrinsic layer 135 separates the contact layer 36 from the diffusion regions 170 and 175.

The preferred embodiment operates by applying a voltage source V2 to contact layer 32, ground 7 to contact layer 36, a positive voltage source V3 to diffusion 170, and a negative voltage source V4 to diffusion 175. The voltage V2 with respect to ground 7 is used to modify the electric field across the active region 120 of the vertical p-i-n structure. The vertical p-i-n structure has a built in field due to the doping of contact layers 32 and 36. The V2 voltage is swept between a negative voltage and the flatband voltage of the p-i-n structure to modify the wavelength of light emitted from the active region 120. The flatband voltage of this structure is approximately 1.5 volts at room temperature. Light is emitted from the active region 120 because carriers are supplied to the conduction and valence states of the quantum wells due to the forward biasing of the horizontal p-i-n structure formed by diffusion 170, the active region 120, and diffusion 175. Voltage V3 is positive enough with respect to voltage V4 such that the horizontal p-i-n structure is forward biased but below the flatband voltage of diffusion 170 and layer 36 to avoid leakage current between diffusion 170 and layer 36. In this structure V3 must be approximately 1.5 volts more positive than V4.

A further modification of the preferred embodiment of the present invention is a structure having no cap layer. In particular, the p-type cap layer is replaced by a metal layer such as gold or nickel. This metal layer produces a Schottky-barrier contact which applies the electric field to the active region 120. In this embodiment, cladding layers 110 and 115 as well as layers 130 and 135 are undoped layers which still have a varying aluminum content. In general, electrical pumping of the vertical coupled quantum well structure by the horizontal p-i-n structure forms a compact tunable semiconductor laser 30 which is useful for many applications because of its simple structure and operation.

Figure 8:
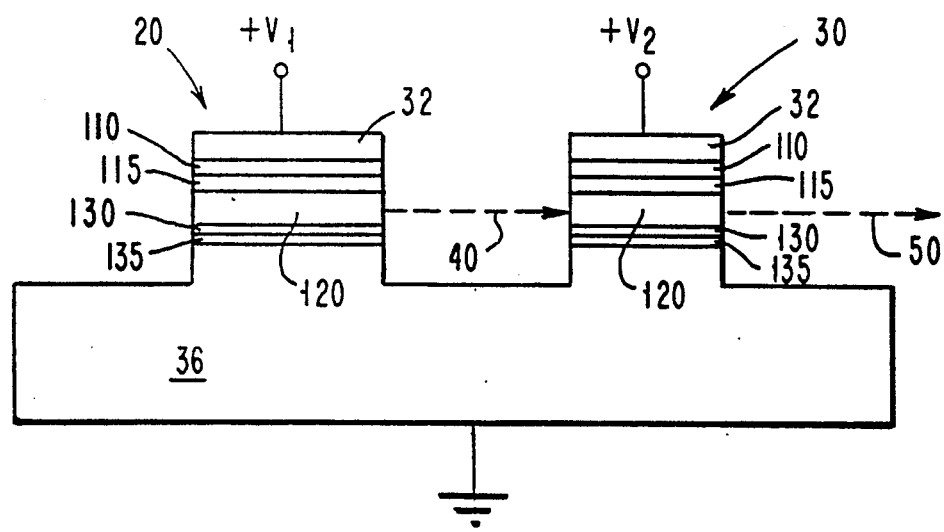
FIG. 8 illustrates an alternate embodiment of the present invention.

FIG. 8 illustrates still another embodiment of the present invention. FIG. 8 illustrates two semiconductor lasers having a common doped contact region 36. Region 36 is doped to a concentration of approximately $2 \times 10^{18}/cm^3$. A pump laser 20 injects light 40 directly into the active region 120 of the tunable laser 30. The physical structure of the pump laser 20 is identical to the structure of the tunable laser 30. The active regions in both lasers comprise at least one pair of coupled quantum wells in which the barrier layer has a thickness of between a monolayer and 35 Å, and the quantum wells are between 20 and 60 Å. The active region is interposed between two sets of cladding layers. The first cladding layers 115 and 130 are doped layers of $Al_xGa_{1-x}As$ wherein x varies in a piecewise linear fashion, as a function of distance away from the active layer, from approximately 0.23 to 0.63. The second cladding layers 110 and 135 are also $Al_xGa_{1-x}As$ layers wherein x is approximately 0.63. The cladding layer 110 is doped p-type to a concentration of approximately $10^{18}/cm^3$. The cladding layer 115 is doped p-type to a concentration of approximately $5 \times 10^{17}/cm^3$. The cladding 130 is doped n-type to a concentration of approximately $5 \times 10^{17}/cm^3$ and cladding layer 135 is doped n-type to a concentration of approximately $10^{18}/cm^3$.

Although the physical structure of the pump laser 20 is the same as the tunable laser 30, the operating conditions of the pump laser is not the same as the tunable laser 30. The operation of the pump laser 20 does not take advantage of the tunability provided by the coupled quantum well effects. It is not necessary that the two laser structures be the same, however inclusion of the coupled quantum wells does not impede the operation of the pump laser in a conventional mode. As a result, for ease of fabrication of the devices on the same substrate, the structure of the two devices is the same. The pump laser 20 operates in the conventional mode wherein the voltage V1 applied to the contact region 32 is positive enough with respect to the ground potential connected to the common contact region 36, that the resulting p-i-n structure is forward biased. When the p-i-n structure is forward biased current flows from the voltage source to ground, supplying carriers to the active region 120. Carriers in the active region quantum wells recombine and emit light 40. The wavelength of light 40 is not modulated by the voltage V1 because, when the p-i-n structure is forward biased, there is only a very small electric field across the active region which is not sufficient to modulate the wavelength of the emitted light.

The pump laser 20 excites carriers from the valence states to the conduction states of the quantum wells in the tunable laser 30 by transmitting light 40 into the active region 120 of the tunable laser 30. The excited carriers in laser 30 recombine and emit light 50. The wavelength of the light 50 is modulated by voltage V2. Voltage V2 sweeps between a negative voltage and the flatband voltage of the structure to modulate the electric field across the active region 120. The flatband voltage of this structure is 1.5 volts. The built in electric field is sufficient to shift the wavelength of emitted light 7 nm over approximately a 1.5 volt change in V2 for this structure. When voltage V2 becomes significantly negative with respect to ground, the change in wavelength has saturated due to the resulting dipole set up by the changes in the carrier distribution function. When voltage V2 is greater than 1.5, so that the p-i-n structure is forward biased, then the electric field is too small to modulate the wavelength of the emitted device.

While the invention has been described and illustrated with respect to plural embodiments thereof, it will be understood by those skilled in the art that various changes in the detail may be made therein without departing from the spirit, scope, and teaching of the invention. Specifically, different materials may be substituted for the AlGaAs system to form the quantum wells, barrier layers, and cladding layers. Also, the invention contemplates operation of the device at higher temperatures, including room temperature. Therefore, the invention disclosed herein is to be limited only as specified in the following claims.

Having thus described our invention what we claim as new and desire to secure as Letters Patent, is:

1. A semiconductor laser for producing light, comprising:
   a longitudinal cavity formed by a longitudinal active region interposed between at least two reflective facets formed substantially perpendicular to said longitudinal cavity;
   said longitudinal active region consisting of two coplanar quantum well layers forming two quantum wells, said quantum well layers having a thickness of less than approximately 60 Angstroms, and said longitudinal active region having a barrier layer interposed between said quantum well layers, said barrier layer having a thickness of less than approximately 35 Angstroms, said barrier layer being coplanar with said quantum well layers;
   said longitudinal active region being interposed between an N-type and a P-type contact layer, said N-type and P-type contact layers creating a built-in electric field substantially perpendicular to said longitudinal active region and corresponding to a built-in voltage, said N-type contact layer being coupled to a first voltage and said P-type contact layer being coupled to a second voltage, said first voltage having a value greater than said second voltage minus said built-in voltage.

2. A semiconductor laser, as in claim 1, wherein:
   said electric field acting on said barrier layer and said quantum well layers tunes the wavelength of said light produced by said semiconductor laser.

3. A semiconductor laser, as in claim 1, wherein:
   said quantum well layers are formed from GaAs, and said barrier layer is formed from $Al_xGa_{1-x}As$, wherein x ranges from approximately 0 to 0.63.

4. A semiconductor laser, as in claim 3, wherein:
   an electric field acting on said barrier layer and said quantum well layers tunes the wavelength of said light produced by said semiconductor laser.

5. A semiconductor laser for producing light, comprising:
   a longitudinal cavity formed by a longitudinal active region interposed between at least two reflective facets formed substantially perpendicular to said longitudinal cavity;
   said longitudinal active region comprising a plurality of coupled quantum well regions, each of said plurality of coupled quantum well regions consisting of a barrier layer interposed between two quantum well layers;
   each of said quantum well layers having a thickness of less than approximately 60 Angstroms, each of said barrier layers having a thickness of less than approximately 35 Angstroms; and each of said plurality of coupled quantum well regions separated from an adjacent coupled quantum well region by at least one isolation region having a thickness of at least approximately 100 Angstroms;
   said longitudinal active region being interposed between an N-type and a P-type contact layer, said N-type and P-type contact layers creating a built-in electric field substantially perpendicular to said longitudinal active region and corresponding to a built-in voltage, said N-type contact layer being coupled to a first voltage and said P-type contact layer being coupled to a second voltage, said first voltage having a value greater than said second voltage minus said built-in voltage.

6. A semiconductor laser, as in claim 5, wherein:
   said electric field acting on said plurality of coupled quantum well regions tunes the wavelength of said light produced by said semiconductor laser.

7. A semiconductor laser, as in claim 5, wherein:
   said quantum well layers are formed from GaAs,
   said barrier layers are formed from $Al_xGa_{1-x}As$, wherein x ranges from approximately 0 to 0.63
   said isolation regions are formed from $Al_xGa_{1-x}As$, wherein x ranges from approximately 0 to 0.63.

8. A semiconductor laser, as in claim 7, wherein:

an electric field acting on said plurality of coupled quantum well regions tunes the wavelength of said light produced by said semiconductor laser.

9. A method for modulating light wavelength, comprising:

pumping a semiconductor laser which comprises a longitudinal active region interposed between an N-type and a P-type contact layer wherein said longitudinal active region comprises two quantum well layers and a barrier layer, said quantum well layers forming two quantum wells having a thickness of less than approximately 60 Angstroms, said barrier layer separates said quantum wells by less than approximately 35 Angstroms, said pumping produces light from said laser having a frequency range; and applying a first voltage to said N-type contact layer and a second voltage to said P-type contact layer wherein said first voltage is greater than said second voltage minus a built-in voltage created by said N-type and P-type contact layers and wherein said first and second voltages modulate said frequency range.

10. A method for modulating light wavelength, as in claim 9, wherein:

said pumping step comprises generating an incident light having a narrow band of wavelengths;

focusing said incident light on said semiconductor laser; and transmitting said incident light to said semiconductor laser.

11. A method for modulating light wavelength, as in claim 9, wherein:

said pumping step comprises electrically contacting at least two areas of said longitudinal active region; and applying a voltage between said two longitudinal active region contacts wherein said applied voltage induces a current flow between said longitudinal active region contacts.

12. A method for modulating light wavelength, as in claim 10, wherein:

said pumping step further comprises focusing said incident light directly on said longitudinal active region of said laser and transmitting said incident light directly to said longitudinal active region.

13. A method for modulating light wavelength, comprising:

pumping an active region of a semiconductor laser which comprises a longitudinal active region interposed between an N-type and a P-type contact layer wherein said longitudinal active region comprises at least two coupled quantum well regions, each of said coupled quantum well regions comprises two quantum well layers and a barrier layer, said quantum well layers forming a quantum well having a thickness of less than approximately 60 Angstroms, said barrier layer separates said quantum wells by less than approximately 35 Angstroms, said pumping produces light from said laser having a frequency range; and applying a first voltage to said N-type contact layer and a second voltage to said P-type contact layer wherein said first voltage is greater than said second voltage minus a built-in voltage created by said N-type and P-type contact layers and wherein said first and second voltages modulate said frequency range.

14. A method for modulating light wavelength, as in claim 13, wherein:

said pumping step comprises generating an incident light having a narrow band of wavelengths;

focusing said incident light on said semiconductor laser; and transmitting said incident light to said semiconductor laser.

15. A method for modulating light wavelength, as in claim 13, wherein:

said pumping step comprises electrically contacting at least two areas of said longitudinal active region; and applying a voltage between said two longitudinal active region contacts wherein said applied voltage induces a current flow between said longitudinal active region contacts.

16. A method for modulating light wavelength, as in claim 14, wherein:

said pumping step further comprises focusing said incident light directly on said longitudinal active region of said laser and transmitting said incident light directly to said longitudinal active region.

* * * * *